United States Patent [19]
Appelt et al.

[11] Patent Number: 5,928,970
[45] Date of Patent: Jul. 27, 1999

[54] DUSTFREE PREPREG AND METHOD FOR MAKING AN ARTICLE BASED THEREON

[75] Inventors: Bernd Karl Appelt, Apalachin; William Thomas Fotorny, Endicott; Robert Maynard Japp, Vestal; Kostantinos Papathomas, Endicott; Mark David Poliks, Vestal, all of N.Y.

[73] Assignee: International Business Machines Corp., Armonk, N.Y.

[21] Appl. No.: 09/010,279

[22] Filed: Jan. 21, 1998

Related U.S. Application Data

[63] Continuation-in-part of application No. 08/716,815, Sep. 10, 1996, Pat. No. 5,719,090, application No. 08/716,813, Sep. 10, 1996, Pat. No. 5,780,366, and application No. 08/716,814, Sep. 10, 1996, Pat. No. 5,756,405.

[51] Int. Cl.$^6$ ..................................................... B32B 27/04
[52] U.S. Cl. .............................. 442/19; 442/66; 428/373; 428/374
[58] Field of Search ........................ 442/19, 66; 428/373, 428/374

[56] References Cited

U.S. PATENT DOCUMENTS

| | | |
|---|---|---|
| 3,932,250 | 1/1976 | Sato et al. . |
| 4,737,403 | 4/1988 | Simpson et al. . |
| 4,997,703 | 3/1991 | Gehrig . |
| 5,470,647 | 11/1995 | Zimics et al. . |
| 5,582,872 | 12/1996 | Prinz . |
| 5,620,789 | 4/1997 | Gan et al. . |

*Primary Examiner*—Richard Weisberger
*Attorney, Agent, or Firm*—William N. Hogg

[57] ABSTRACT

A method for coating cloth especially fiberglass sheets with a thermosetting resin and resulting structure is provided. The coating is performed in two steps. In the first step, essentially all of the strands of the fiberglass are coated with the resin/solvent mixture while maintaining at least some of the interstices or openings essentially free of the solvent mixture. This first coating is then partially cured to between about 70% and 90% of full cure. The coated fiberglass with partially cured resin thereon is then given a second coating of either the same or different thermosetting resin mixture which coats the first coating and fills in the interstices between the fibers. This second coating is then partially cured, which advances the cure of the first coating past 80% full cure and results in an impregnated fiberglass cloth structure for use as sticker sheets. During lamination, the first coating acts like an impenetrable insulating sheet, preventing resin displacement and, therefore, preventing glass fiber contact with the conductive planes. The second coating is fluid enough to fill in spaces in the planes and to form the adhesive bond to cores and conductive layers. The structure reduces the tendency of the resin to flake and produce dust during subsequent processing operations.

11 Claims, 2 Drawing Sheets

DUSTFREE PREPREG AND METHOD FOR MAKING AN ARTICLE BASED THEREON

RELATED APPLICATIONS

This is a Continuation-in-Part of application Ser. No. 08/716,815, filed Sep. 10, 1996, now U.S. Pat. No. 5,719,090, for "Technique for Forming Resin-Impregnated Fiberglass Sheets with Improved Resistance to Pinholing" (Attorney Docket No. EN9-96-029); and application Ser. No. 08/716,813, filed Sep. 10, 1996, now U.S. Pat. No. 5,780,366, for "Technique for Forming Resin-Impregnated Fiberglass Sheets Using Multiple Resins" (Attorney Docket No. EN9-96-030); and application Ser. No. 08/716,814, filed Sep. 10, 1996, now U.S. Pat. No. 5,756,405, for "Technique for Forming Resin-Impregnated Fiberglass Sheets" (Attorney Docket No. EN9-96-028).

FIELD OF THE INVENTION

This invention relates generally to forming of resin-impregnated cloth, and more particularly to forming improved resin-impregnated fiberglass sheets and the resultant sheets which are specially adapted for use in forming chip carriers and the like, and which have improved resistance to generating dust particles during forming operations.

BACKGROUND OF THE INVENTION

Resin-impregnated fiberglass sheets are commonly used in the formation of printed circuit boards. The fiberglass cloth is typically impregnated with the selected thermoset resin which is then partially cured and the impregnated cloth sheared to form what are known as sticker or prepreg sheets. In order to enhance the adhesion of the resin to the fiberglass, often a coupling agent, such as a silane, is coated onto the surface of the fiberglass prior to impregnation. The prepreg sheets are then laid up with sheets of metal such as copper or copper-invar-copper (CIC) and laminated with heat and pressure to fully cure the laid-up laminate with the metal sheets defining ground, power and signal planes. One of the desirable characteristics of the resin impregnated fiberglass sheets is that the coated resin must cover the fibers of the fiberglass and must be able to be partially cured to a non-tacky state wherein the sheets can be handled for the lamination process. This is often referred to as B-stage, a cure state which allows the sheets to be sufficiently self-supporting to be laid up as a laminate, but not advanced enough in the state of cure that they are rigid or non-flowable when heated, and they can be further cured to C-stage, a state of full cure, with heat and pressure to form a laminate structure as is well known in the art. As indicated above, this lamination process normally includes the lamination of one or more sheets of metal, such as copper, CIC or other metal, to provide necessary ground planes, power planes and signal planes buried within the laminated circuit board. Also in conventional practice, openings are formed, either by drilling or other means, through the fully cured laminates which form the openings for vias or plated through holes where the connections can be made from one surface of the circuit board to the other and to the various internal planes within the laminate as required.

A conventional technique of forming the resin-impregnated fiberglass sheets is to provide a coil of the fiberglass material and unwind the fiberglass material from the coil and continuously pass it through a tank containing the solution of the desired resin in a solvent, and then pass the coated or impregnated material through a treater tower wherein heat is applied to drive off the solvent and to partially cure the resin material by initiating cross-linking and then coiling the partially-cured or B staged material into a coil. Thereafter, the partially-cured material is uncoiled and cut into sheets of the desired length. These sheets, known as prepreg sheets, are then used in the lamination process described above.

This prepreg material has long been used for manufacturing circuit boards; however, more recently, the same prepreg material and same laminating techniques that have been used to form a circuit board have been used to form chip carriers. A chip carrier is basically a small-size version of a circuit board where the metallurgy and the lay out can be much finer than on a circuit board. Printed circuit board reliability tests are defined, e.g., in IPC specifications, whereas chip carrier tests are defined by JEDEC specifications which are derived for ceramic carriers and are more severe tests. During many of these manufacturing, or forming operations, such as slitting, trimming, drilling or punching of registration slots or bending handling during lay-up, the resin may delaminate from the glass fibers which in turn can generate dust particles of the resin. The dust particles which settle on top of the metal foils during lay-up into cores or composites, melt and cure during lamination, forming spots which are very resistant to chemical processing or cleaning. In chip carriers with fine line circuitry even small amounts of dust of small diameter can cause problems with forming the copper circuitry. These problems are especially pronounced where substractive etching of full surface plate metallurgy is performed to form electrical circuits or traces. Briefly, small amounts of dust can interfere with the etching process, and even "clean room" procedures during lay-up and lamination do not totally eliminate such problems. Thus, it is desirable to provide a sticker sheet having improved resistance to generating dust.

It is thus an object of the present invention to provide laminated glass fiber reinforced structures and a method of making the same which structures are utilized for chip carriers which have a reduced propensity to generate dust particles during forming operations.

SUMMARY OF THE INVENTION

According to the present invention, a method for coating cloth, especially fiberglass sheets, with a resin and resulting structure is provided. The coating is performed in two steps. In the first step, essentially all of the strands of the fiberglass are coated with the resin solvent mixture, and wherein some and preferably most interstices or openings are free of the solvent resin mixture. This first coating is then partially cured to the extent that it will not redissolve in a second coating of the same resin solution and also upon heating to cure the coating the first coating is at least 70% cured, and up to 90% cured and preferably more than 80% cured to form a good adhesive bond to the glass fibers. The coated fiberglass with partially cured resin thereon is then given a second coating preferably of the same resin mixture which coats the first coating and fills in any unfilled interstices between the fibers. In some embodiments a different second resin may be employed. This second coating is then partially cured (e.g. 20% to 40% cured), which advances the cure of the first coating (to over 80% cured and preferably to 90% to 100% cured) and results in an impregnated fiberglass cloth structure for use as sticker sheets. During fabrication, the first coating which has been significantly, but not fully cured is strongly adherent to the glass fibers thus reducing the probability of breaking away from the fibers and forming dust particles during fabrication. The second coating is fluid enough to fill in spaces or interstices and only partially cured

DESCRIPTION OF THE PREFERRED EMBODIMENT(S)

Figure 1:
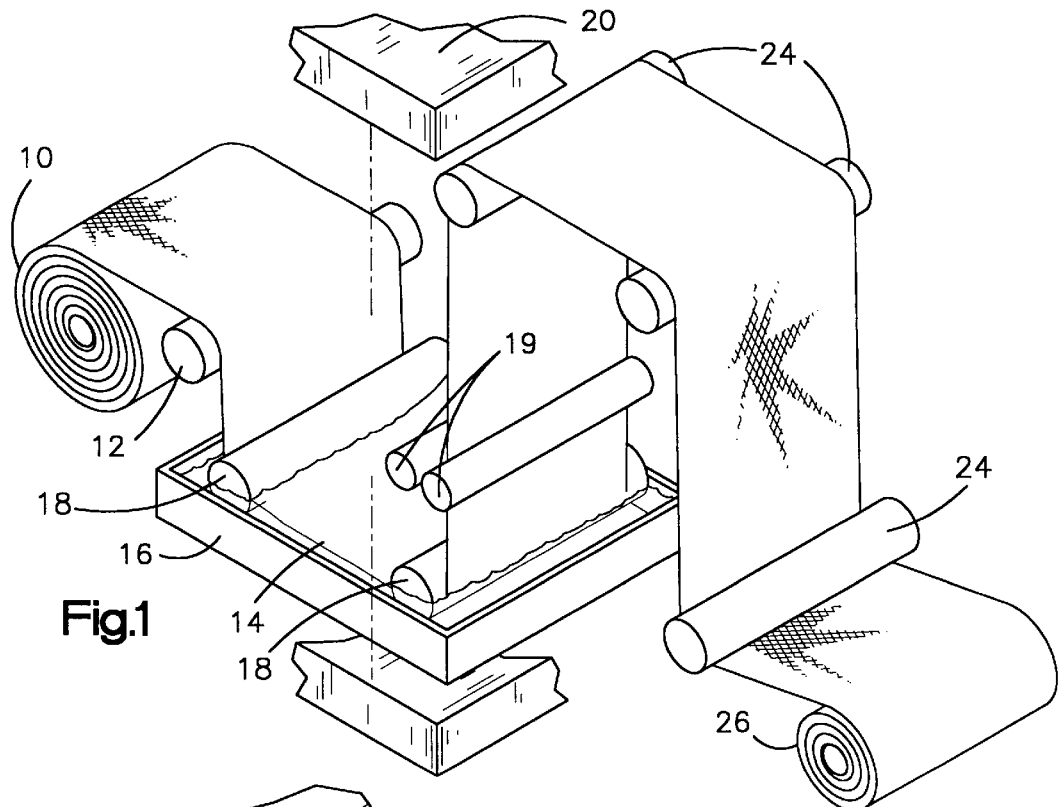
FIG. 1 is a somewhat schematic representation of an apparatus for impregnating fiberglass cloth with resin and partially curing the impregnated fiberglass.

Referring now to the drawings, and for the present to FIG. 1, a somewhat schematic representation of coating of the fiberglass cloth with resin/solvent solution and partially curing the resin is shown. A roll of fiberglass cloth 10 is shown which passes over a guide roll 12 into a solution 14 of the desired resin maintained in a selected solvent. (It is to be understood that the term "solution" is used here to describe the resin in a solvent, whether or not it be a true solution.) The solution 14 is maintained in a tank 16, and the fiberglass cloth from the roll 10 is maintained submerged in the tank by a pair of sink rolls 18. The fiberglass from the roll of fiberglass cloth 10 is passed through the solution 14 into a treater tower 20. The solution impregnates the fiberglass cloth 10 with the resin/solvent solution. The amount of resin on the cloth is usually controlled by metering rolls 19.

The treater tower 20 has a series of rolls 24 over which the fiberglass cloth 10 is reeved, and the treater tower 20 is heated, either by convection or by radiation, such as infrared radiation or by microwave, or by some other mechanism to drive the solvent from the solution and to partially cure the resin by initiating the cross-linking. The tower 20 is divided into several zones in which the temperature and the gas flow can be controlled independently. The exiting material, known as prepreg, now is comprised of glass cloth and partially reacted resin and is largely free of solvent. This state of the material is known as a B-stage, and the amount of curing required for the B-stage is well known in the art. Specifically, this B-staged resin is sufficiently cured to form a sheet of material which has the resin in such a form that it will remain in the fiberglass material and is sufficiently uncured that it can bond to other similar sheets of material and to metal sheets and be further cured to a hardened state upon application of heat and pressure. The amount of resin applied to the sheet is a function of the nature of the fiberglass cloth 10, as well as the speed of the travel of the fiberglass cloth 10, setting of the metering rolls 19, the composition of the solution of resin and solvent 14, and various physical parameters such as the temperature, viscosity and other well known factors of the solution. Likewise, the amount of cure is a function of the temperature of the tower, the amount of solution and resin applied to the fiberglass cloth, the composition of the solution, the composition of the resin and time at temperature in the tower all of which also are well known in the art. The fiberglass cloth 10 as it emerges from the treater tower 20 in the B-stage state is wound into a coil of partially-cured material 26.

In conventional practice, a single pass of the fiberglass cloth 10 through the solution 14 and the treater tower 20 is used. The partially-cured fiberglass is then ready to be uncoiled and cut into sheets often referred to as prepreg sheets or sticker sheets for forming a laminated structure.

Figure 2A:
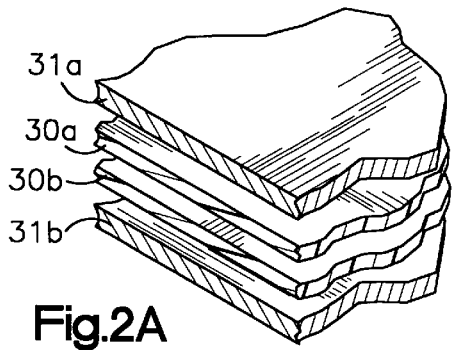
FIG. 2A is a very schematic representation of forming of sheets of partially-cured impregnated resin and copper sheets positioned to form a laminate core structure.
Figure 2B:
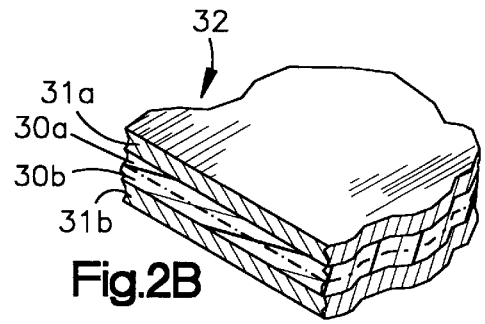
FIG. 2B is a schematic representation view of a portion of a raw core formed from sticker sheets and copper sheets.

In order to form a chip carrier or a circuit board, alternate layers of B-stage cured prepreg sheets and sheets of conductive material such as copper or copper-invar-copper (CIC) as shown in FIG. 2A are laminated together. In one typical lamination process, one or more, and conventionally two, sheets of prepreg 30a, 30b are laminated between two sheets of copper or CIC 31a, 31b using heat and pressure to form a raw core 32 (FIG. 2B). (Because of the heat and pressure, the two sheets of prepreg 30a, 30b bond together to form an essentially continuous or single layer, and bond to the two sheets of copper or CIC 31a and 31b. The sheets of prepreg 30a, 30b are essentially fully cured as shown in FIG. 2B with a dotted line indicating their interface.

This raw core can, in the simplest embodiment, be circuitized to form a chip carrier or circuit board. Using photolithographic subtractive etching and drilling techniques, the sheets 31a and 31b are circuitized to form the desired circuitry on both sides of the prepreg sheets 30a and 30b and plated through holes formed where needed.

Figure 2C:
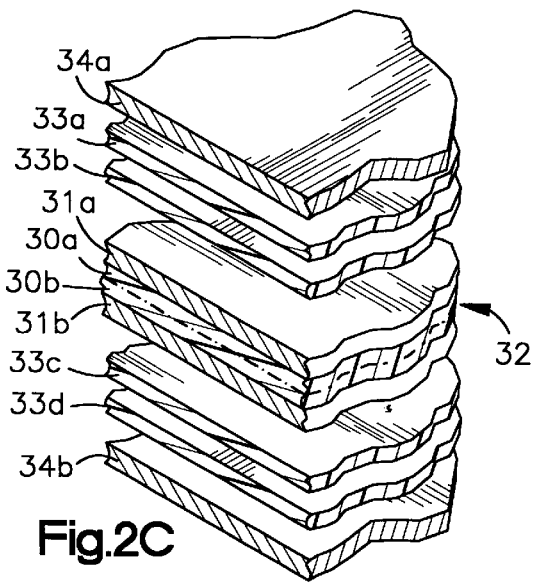
FIG. 2C is a schematic representation of a raw core and sticker sheets and copper sheets positioned to be laminated and form a chip carrier.
Figure 2D:
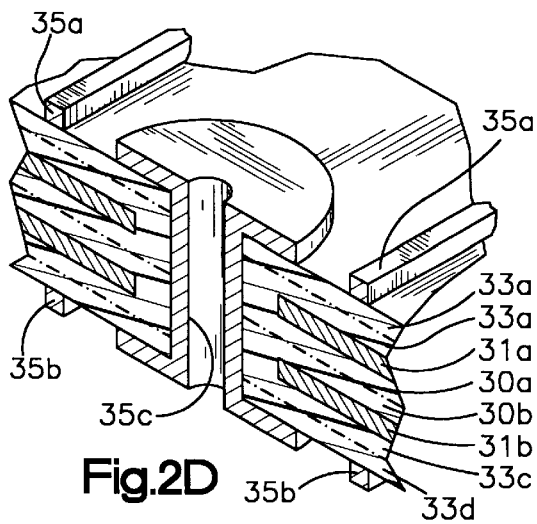
FIG. 2D is a schematic representation of a chip carrier.

In other embodiments, the core 32 is used to form buried planes such as ground planes and power planes, or even signal planes. As shown in FIG. 2C, two additional sheets of prepreg 33a and 33b are laminated to sheet 31a and to a sheet of copper 34a and two additional sheets of prepreg 33c and 33d are laminated to sheet 31b and sheet of copper 34b and essentially fully cured by heat and pressure. These sheets, ready for lamination, are shown in FIG. 2C. Copper sheets 34a and 34b are used to form circuit traces 35a and 35b by subtractive etching. Plated through holes 35c are formed in a conventional manner as shown in FIG. 2D. These raw cores and completed circuit boards or chip carriers are well known in the art as are the various techniques for forming them, and thus they are only briefly described.

The above-described techniques are well known in the art. According to conventional prior art techniques, the impregnation of the fiberglass with the resin/solvent solution followed by the B-stage is done in a single step, wherein the desired amount of resin is applied and cured, and the sheets are then uncoiled and formed into sticker sheets after the single impregnation and B-stage step. However, in the formation of a chip carrier, as indicated above, dust formed during processing can cause defects in the circuitry. Such defects result from dust settling on the copper sheets and interfering with the substractive etching to form circuitry, thus necessitating scrapping of a substantial amount of the final product. These dust particles are formed at various stages of the manufacturing of the prepreg sheets including roll up on the rolls at the exit side of the treater tower, slitting after the B-stage cure, forming registration holes or slots, drilling, and handling during lay-up to form cores or composites. This dust is carried on the surface of the prepreg sheets during its progress through the various stages of manufacturing of the cores or composites, and eventually settles on the copper sheets during lamination. This dust can prevent the etching solution from etching the copper resulting in shorts, near shorts, and other circuit defects. It is believed that the dust results from fracturing and cracking of the incompletely cured (B-cured) resin around the fiber glass strands, especially since it is only B-stage cured at these stages of processing.

Figure 3:
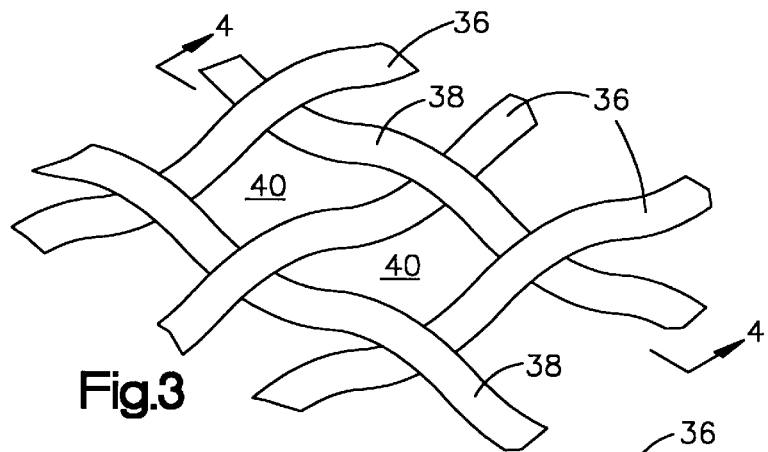
FIG. 3 is a view on an enlarged scale of the portion of woven fiberglass cloth before coating according to this invention.
Figure 4:
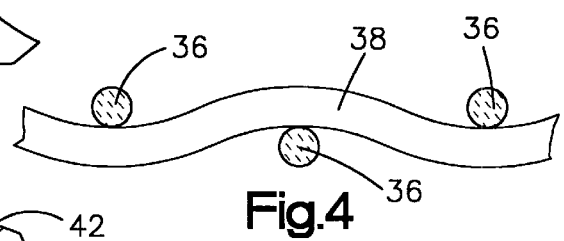
FIG. 4 is a sectional view taken substantially along the plane designated by the line 4—4 of FIG. 3.
Figure 5:
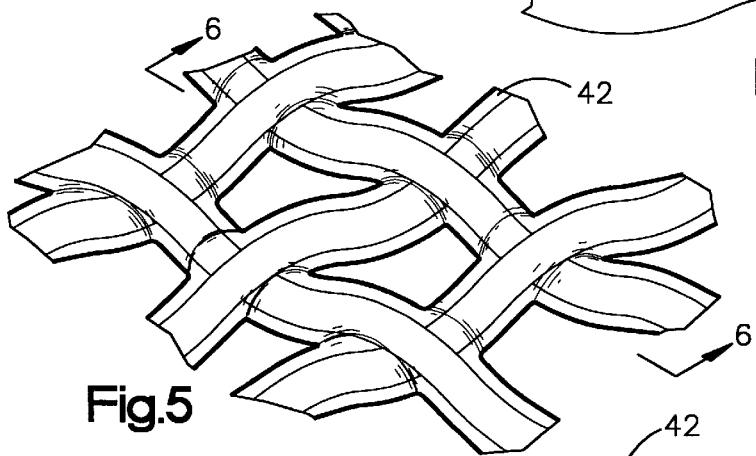
FIG. 5 is a view similar to FIG. 3 after the initial coating of the fiberglass cloth with a resin and partially cured according to this invention.
Figure 6:
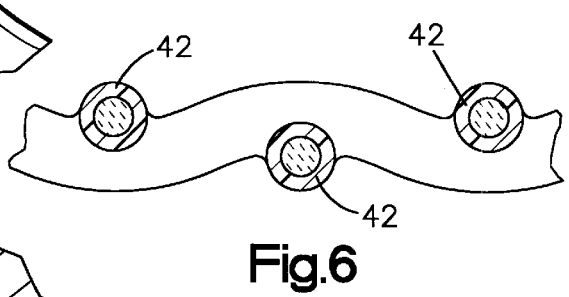
FIG. 6 is a sectional view taken substantially along the plane designed by line 6—6 of FIG. 5.

According to one embodiment of the present invention, the impregnating and partial curing of the resin into the fiberglass sheet is accomplished in two steps; i.e., two separate coating and partial curing operations are performed on a roll of fiberglass material. During the first pass, the solution concentration, temperature and viscosity of the solution of resin, as well as the speed of travel of the strip of material 26, are selected such that as fiberglass cloth passes through the solution, the solution coats only the fibers and does not coat the interstices or spaces or windows between the fiber bundles. The material with this first coating thereon passes through the treater tower 20 and is partially cured in a conventional manner, but to a higher degree of cure, i.e. between about 70% to 90% and preferably more than 80% of full cure. This is shown schematically in FIGS. 3–6. FIGS. 3 and 4 show a small section of woven fiberglass cloth before coating. The cloth has bundles of woof fibers 36 and bundles of warp fibers 38 which are woven in a conventional way to form interstices or windows 40. The glass may have an adhesion-promoting coating, such as a silane (not shown) thereon. After the first pass and partial cure, the resin material forms a coating 42 of partially-cured resin over the fibers 36 and 38, while leaving the windows 40 essentially free of resin. This is shown schematically in FIGS. 5 and 6. The first pass coating must be sufficiently cured that it will not redissolve in the resin solution of the second pass and preferably is cured beyond this stage to a point wherein it will still bond to the coating in the second pass, but upon subsequent heating will cure to near full cure during partial cure of a second coating. This stage of cure is between about 70% and about 90% and preferably more than 80% of full cure. The fiberglass, coated and partially cured, is left in the coil form and is then given a second pass through a solution 14 of the same resin and solvent. The resin solution during the second pass coats not only over the coating 42 on the fibers 36 and 38, but also fills in the windows 40 to form an outer coating 44.

Figure 7:
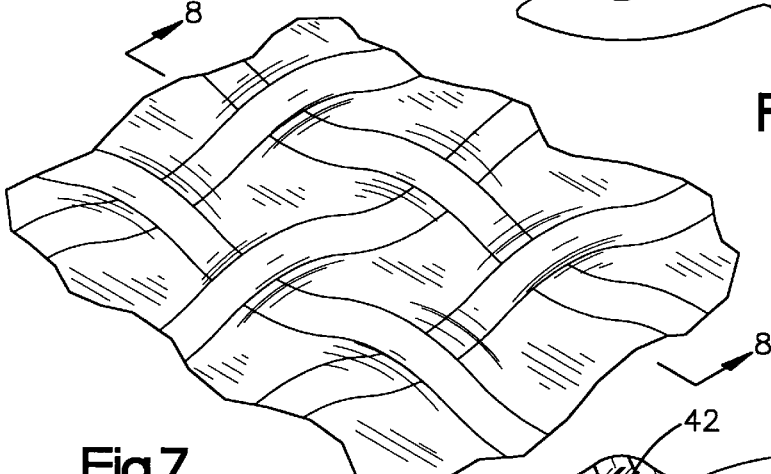
FIG. 7 ia a view similar to FIGS. 3 and 5 after a second coating of resin has been placed over the first coating of the fiberglass cloth.
Figure 8:
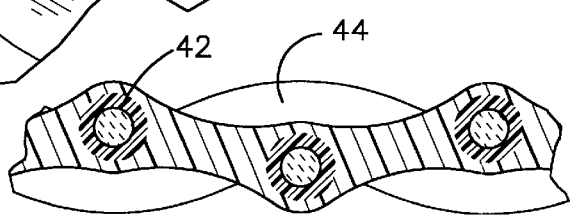
FIG. 8 is a sectional view taken substantially along the plane designated by the line 8—8 of FIG. 7.

Since the fiberglass cloth on the second pass is also passed through the treater tower 20, the outer coating is partially cured to about 20% to about 40% of full cure, while the heat advances the cure of the inner coating 42. The amount of cure of the inner coating after the second pass is at least about 80% and preferably at least about 90% and can be up to 100% of full cure. The second coating 44 forms a bond with the coating 42 on the fibers 36 and 38 during the partial cure. This condition is shown in FIGS. 7 and 8. It should be understood, however, that the sharp demarkation between the first and second layers shown in FIG. 8 is for the purpose of illustration, and that the transition between these layers is smooth and such that the two layers are substantially continuous; i.e., the bonding and cross-linking of the polymer results in essentially a continuous film of polymer formed of two layers. However, before final cure during lamination, the two different layers are discernable, but with a rapid and smooth transition.

It should be understood that the second coating procedure could be performed on a second coating line in a continuous manner following the emergence of the partially cured cloth from the treater tower 20 after the first coating, thus obviating the necessity of coiling and recoating in the same line.

After the second coating process wherein the outer coating 44 is applied and partially cured, the sheets are then cut, and further processing to form cores or composites takes place in a conventional manner. The further curing during lamination finishes the bonding process of the outer coating 44 to the inner coating 42, making a strong adherent structure.

The specific resins used can vary, as long as the resin has the properties of being able to be coated from a solution, aqueous or solvent, and partially cured, and in the first coating to adhere only to the fibers and leave the windows open. Particularly useful resins are epoxy resins, such as XU8213 sold by Ciba-Geigy Company, which are well known in the art, and also bismaleimide triazine (BT) which can be used alone, or which is preferably blended with epoxy. This blend when blended with epoxy preferably is a 60/40 or 50/50 BT:epoxy blend. The BT/epoxy blend has a particularly good adherence to glass thus forming a good interface and encapsulating the glass fibers during the first pass. If epoxy alone is used, epoxy has a particularly good interface to copper. Other useful resins include polyimides and cyanate esters, and mixtures of cyanate esters and epoxies. In any event, in this embodiment the same resin that is used for the first pass is used for the second pass, with the loading, viscosity, temperature and speed of the fiberglass cloth being adjusted in each pass to provide, during the first pass, the coating of the fibers and, during the second pass, the coating of the already coated fibers and filling in of the windows.

The following table is an example of a procedure and parameters and materials used to form a roll of epoxy fiberglass impregnated utilizing two passes according to this invention compared with a procedure and parameters and materials typically used in a single pass prior art technique.

TABLE

GRADE 1080 FIBERGLASS CLOTH[1]

| | Single Pass | Two Passes | |
|---|---|---|---|
| | Prior Art | First Pass | Second Pass |
| Treated Weight[2] | 9.9 | 4.5–6.0 | 9.9 |
| Resin Content[3] | 59 | 11–33 | 59.4 |
| Flow[4] | 25–30 | N/A | 25–40 |
| % Fully Cured[5] | 20–45 | 70–90 | 20–40 |
| Line Speed[6] M/Min. | 9–14 | 2–4 | 9–14 |
| Resin SpG.[7] Gr/CC | 11 | 11.04–11.20 | 11.04–11.20 |
| Resin Solids[8] | 65% | 65% | 65% |
| Catalyst Level[8] (PHR) | 0.13 | .13–.25 | .10–.17 |
| Meter Roll Gap.[10] (um) | 180–230 | 180–230 | 180–230 |
| Meter Roll Speed[11] (M/Min) | 2.5 | 34 | 2.0–3.0 |
| Oven temps[12] | | | |
| Zone #1 (° C.) | 110 | 100–120 | 100–120 |
| Zone #2 (° C.) | 115 | 105–125 | 105–125 |

TABLE-continued

GRADE 1080 FIBERGLASS CLOTH[1]

| | Single Pass | Two Passes | |
| --- | --- | --- | --- |
| | Prior Art | First Pass | Second Pass |
| Zone #3 (° C.) | 160 | 160–170 | 150–170 |
| Zone #4 (° C.) | 175 | 165–175 | 165–175 |
| Zone #5 (° C.) | 175 | 165–175 | 165–175 |
| Zone #6 (° C.) | 160 | 160–170 | 150–170 |
| Air Velocity[13] (M/min.) | | | |
| Zones 1 & 2 | 6 | 4.5–6.5 | 4.0–6.0 Zone 1 |
| Zone 3 | 6 | 5.0–7.0 | 4.5–6.5 Zones 2 & 3 |
| Zones 4–6 | 6 | 6.5–7.0 | 5.5–6.5 Zones 4–6 |
| Residence Time[14] (min.) | 2.5 | 11. | 2.5 |

[1]1080 is a standard industry style description of glass fiber cloth having a given fiber size and weave and has a weight of 1.46 oz/yd$^2$.
[2]The weight of 128 square inch piece of cloth after resin impregnation.
[3]The percent of resin in the treated cloth. The preferred resin is ciba-Geigy's XU8213, which is contained in a solvent which is preferably methyl ethyl ketone.
[4]A flow is measured by cutting eight 4" × 4" pieces of prepreg and hot-pressing them together. The amount of resin pressed out is expressed as a percent of the total resin content.
[5]The percent fully cured of the resin as measured by flaking pieces of resin off of the cloth and determining the percent cure. The same procedure is used for the double pass. Since some first pass resin flakes off as well, the cure state of the second layer is somewhat overstated. However, this number is used as the measurement for the second stage cure.
[6]The speed of the cloth as it is driven through the resin solution and the treater tower.
[7]Resin specific gravity.
[8]Resin solids is the percent of resin in the solvent. The preferred solvent is given.
[9]The level of the catalyst, which in the preferred embodiment is 2-methylimidazole in parts per 100 parts of resin.
[10]The gap between the meter rolls.
[11]The meter roll speed in meters per minute.
[12]The oven temperature of the various zones in the treater tower.
[13]The velocity of the air flowing in the treater tower.
[14]The time the impregnated cloth is in the treater tower.

As can be seen from the table above, many of the parameters are the same for both the first pass and the second pass in the present invention. Also, many of the parameters are the same for the second pass of the present invention and the prior art single pass. The main differences are in the line speed and the temperatures of the oven zones on the first pass as compared to the prior art single pass technique. The line speed is significantly slowed down, and the oven temperatures increased somewhat in some of the zones. The slowing down of the line speed results in less resin being impregnated into the cloth than at a faster line speed. This is because during the slow line speed on the vertical run of the cloth as it is coming out of the resin solution, it has more time to drain and, thus, more of the resin which has been coated onto it drains off back into the solution 14 of the resin. The higher temperature in the oven, coupled with the slower speed and optionally, higher catalyst level results in a more complete cure of the first pass resin than is achieved with the prior art single pass technique; i.e., in the prior art single pass technique, the cure for B-stage is 20–45%, whereas after the first pass of the two pass technique according to the present invention, there is preferably about a 70%–90% complete cure. This additional cure is desired to insure that, during the second pass of the present invention, the resin deposited on the first pass and partially cured does not redissolve, but rather remains as a base on which the second pass resin is deposited and that it forms a strong bond to the fibers especially after the second pass when the resin of the first pass is very substantially cured (80% to 100%) which substantially reduces the tendency to flaking and cracking with the resultant generating of dust particles during subsequent operations. Thus, the slower speed and higher temperatures in certain zones of the oven result in a more fully cured resin, coating essentially only the fibers and leaving significant spaces at the interstices which are then covered and fully filled in during the second pass wherein the parameters are preferably about the same as the parameters for a single pass technique. Other modifications such as change in viscosity, change in percentage of resin, etc., can be used to vary the coating weight.

It should be understood that the particular table of parameters is merely illustrative and that these can be varied significantly to obtain the desired results. For example, other cloth styles could be used. Typically, these cloths can include Styles 106, 2116 or 7628, as well as others which are suitable for resin impregnation. In addition, other cloths based on quartz, s-glass or organic fibers can be used. With these other types of cloth, the parameters or conditions of coating on the two passes are modified to obtain the desired results. Also, other resins can be used, as was explained above, which would cause the conditions to be changed, all of which is well-known in the art.

The final cure of at least 80% and up to 100% of the first resin coat to form the prepreg sheet results in a prepreg or sticker sheet that has significantly enhanced resistance to generating dust particles during subsequent operations. The following tests demonstrates the improved properties. These tests were performed comparing sheets of prepreg formed according to the prior art single pass as described in the Table with sheets of prepreg formed using two passes as described in the table.

Test 1

Test Procedure

5" strips of each of single pass material and double pass material were folded flat against themselves (i.e. the strip bent 180°). Dust emitted from bends was collected and after 50 bends and weighed.

Test Results

| Single Pass | .018 grams |
| --- | --- |
| Double Pass | .008 grams |

Test 2

Test Procedure

5" strip of each of single pass material and double pass material were pulled around a 0.032" diameter steel rod with 180° of wrap. The dust generated was collected as it came off the rod and weighed.

Test Results

| Single Pass | 0.017 grams |
| --- | --- |
| Double Pass | 0.015 grams |

Test 3

Test Procedure

5" strips of each of single pass material and double pass material were folded and pulled against the edge of a laboratory spatula such that the material was crazed but not cracked. Dust was collected under the fold and weighed.

Test Results

| Single Pass | 0.005 grams |
| Double Pass | 0.002 grams |

Test 4

Test Procedure

Full sheets of single pass material and double pass material had their surfaces rolled with a "sticky" roller to remove any previously generated dust. The sheets were weighed then forced into a laboratory jar having a 1.25" mouth. The prepreg was removed and weighed again.

Test Results:

| | Weight Before Test | Weight After Test | Weight of Dust Generated |
|---|---|---|---|
| Single Pass | 48.40 grams | 47.40 grams | 1.0 grams |
| Double Pass | 49.00 grams | 48.60 grams | 0.4 grams |

While there is no specific fixed mathematical relationship constant between the test procedures and actual production conditions, never-the-less, it is believed that there is at least a 3 fold reduction in the generating of dust using the present invention of forming prepreg sheets as compared to the prior art single pass technique during conventional manufacturing operations. This translates into a significant reduction in defects during the manufacturing process. The percent of defect density in the final product due to particles resulting from the use of prepreg sheets formed according to this invention can be reduced to 0.002% to 0.006% as compared to 0.02% to 0.1% using prepreg formed in a single pass according to prior art techniques.

In the preferred embodiment, the same resin is used for both passes, and the interstices between the fibers are all, or almost all unfilled. However, the interstices can be at least partially filled as described and shown in co-pending application Ser. No. 08/716,815, Filed Sep. 10, 1996.

Moreover, different resins can be used on the first and second passes as described and shown in co-pending application Ser. No. 08/716,813, Filed Sep. 10, 1996. Preferably the resins for the first pass are as disclosed in said application Ser. No. 08/716,813; i.e., epoxies and bismaleimide triazines or mixtures of cyanate esters and epoxies, and the resin for the second coating is an epoxy or mixtures of epoxies. A preferable first pass resin is: BT epoxy—Varnish Formulation: Difunctional epoxy (Ciba 9302)—47.7%; BT blend (Mitsubishi 2060) 40.2%; Solvent (Methyl Ethyl Ketone)—7.3%; Tetra Functional epoxy (Shell 1030)—4.7%; and Catalyst (Zinc Octanoate)—0.03%, and a preferable second pass resin is Ciba-Geigy high Tg epoxy—Formulation: Multifunctional epoxy (Ciba 8213)—90.3%; Solvent (Methyl Ethyl Ketone)—9.7%; and Catalyst (2-Methyl Imidazole)—0.13%, all as described in said application Ser No. 08/716,813, Filed Sep. 10, 1996.

The invention has been described as used with woven glass fiber; however, non-woven fiberglass fabric can also be used even though the interstices are not as pronounced as in woven fabric.

Also, the invention is particularly useful for forming chip carriers where the test requirements are stringent. However, the invention can be used in forming circuit boards if testing indicates this additional cost is justified.

Accordingly, the preferred embodiment of the present invention has been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. A resin impregnated layer of cloth comprising, a sheet of cloth having fibers and interstices between the fibers, a first coating of a selected thermosetting resin surrounding said fibers, with at least some of said interstices unfilled, a second coating of a thermosetting resin disposed over said first coating and essentially filing all said interstices unfilled by said first coating, said first coating being cured to at least 80% of full cure, said second coating being cured to between about 20% to about 40% of full cure, and a rapid transition zone between said first and second coatings that is smooth, substantially continuous with crosslinking between said first and second coatings providing an essentially continuous polymer of two layers.

2. The invention as defined in claim 1 wherein both said first and second resins are the same resins.

3. The invention as defined in claim 2 wherein said resin is an epoxy.

4. The invention as defined in claim 2 wherein the resin is a mixture of epoxy and bismaleimide triazine.

5. The invention as defined in claim 1 wherein said resin of said first coating is different from said resin of said second coating.

6. The invention as defined in claim 5 wherein said resin of said first coating is selected from epoxies and bismaleimide triazine, or mixtures thereof, and polyimides, cyanate esters, and mixtures of cyanate esters and epoxies, and said resin for said second coating is an epoxy or a mixture of epoxies.

7. The invention as defined in claim 6 wherein the resin of said first coating is a mixture of epoxy and bismaleimide triazine.

8. The invention as defined in claim 6 wherein said resin of said second coating is an epoxy.

9. The invention as defined in claim 1 wherein the cloth is selected from fiberglass, s-glass, quartz and organic fibers.

10. The invention as defined in claim 9 wherein the cloth is fiberglass.

11. The invention as defined in claim 1 wherein the cloth is woven cloth.

* * * * *

UNITED STATES PATENT AND TRADEMARK OFFICE
CERTIFICATE OF CORRECTION

PATENT NO. : 5,928,970
DATED : July 27, 1999
INVENTOR(S) : Bernd Karl Appelt   William Thomas Fotorny   Robert Maynard Japp
              Kostantinos Papathomas   Mark David Poliks It is certified that error appears in the above-identified patent and that said Letters Patent is hereby corrected as shown below:

Column 6, in the Table starting at line 46, change the First Pass amount for the Meter Roll Speed (appearing between lines 60 and 65) from "34" to --3-4--.

Signed and Sealed this

Eighth Day of February, 2000

Attest:

Q. TODD DICKINSON

Attesting Officer    Commissioner of Patents and Trademarks